United States Patent
Kobayashi et al.

(10) Patent No.: US 12,432,999 B2
(45) Date of Patent: Sep. 30, 2025

(54) SEMICONDUCTOR DEVICE AND METHOD FOR MANUFACTURING THE SAME

(71) Applicant: Kabushiki Kaisha Toshiba, Tokyo (JP)

(72) Inventors: Yusuke Kobayashi, Yokohama Kanagawa (JP); Tomoaki Inokuchi, Yokohama Kanagawa (JP); Hiro Gangi, Ota Tokyo (JP); Shotaro Baba, Kawasaki Kanagawa (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 406 days.

(21) Appl. No.: 18/168,956

(22) Filed: Feb. 14, 2023

(65) Prior Publication Data

US 2024/0079459 A1    Mar. 7, 2024

(30) Foreign Application Priority Data

Sep. 7, 2022    (JP) .................. 2022-142425

(51) Int. Cl.
*H10D 64/00* (2025.01)
*H10D 62/17* (2025.01)
(Continued)

(52) U.S. Cl.
CPC ......... *H10D 64/111* (2025.01); *H10D 62/393* (2025.01); *H10D 62/405* (2025.01); *H10D 64/514* (2025.01)

(58) Field of Classification Search
None
See application file for complete search history.

(56) References Cited

U.S. PATENT DOCUMENTS

| | | |
|---|---|---|
| 2014/0159192 A1 | 6/2014 | Kakefu |
| 2021/0050344 A1 | 2/2021 | Hosoya et al. |

(Continued)

FOREIGN PATENT DOCUMENTS

| | | |
|---|---|---|
| JP | H09-246570 A | 9/1997 |
| JP | 2008192737 A | 8/2008 |

(Continued)

OTHER PUBLICATIONS

Notice of Reasons for Refusal (Office Action) mailed Apr. 18, 2025 in counterpart Japanese Patent Application No. 2022-142425, with English machine translation, 22 pages.

*Primary Examiner* — Richard A Booth
(74) *Attorney, Agent, or Firm* — Kim & Stewart LLP

(57) ABSTRACT

According to one embodiment, a semiconductor device includes a first electrode, a second electrode, a third electrode; a fourth electrode, a semiconductor member, a first conductive member, a second conductive member, and an insulating member. The semiconductor member includes first, second and third semiconductor regions. The first semiconductor region includes a first outer edge region, a first partial region, a second partial region, a third partial region, and a fourth partial region. The first, third and fourth partial regions are of a first conductivity type. The second semiconductor region is of a second conductivity type. The third semiconductor region is of the first conductivity type. The second conductive member includes a first conductive portion. The insulating member includes a first insulating region and a second insulating region. An electrical resistivity of the second partial region is higher than an electrical resistivity of the first partial region.

18 Claims, 12 Drawing Sheets

(51) Int. Cl.
    *H10D 62/40*         (2025.01)
    *H10D 64/27*         (2025.01)

(56)            References Cited

U.S. PATENT DOCUMENTS

2021/0175339 A1\*   6/2021   Inokuchi .............. H10D 30/635
2021/0391452 A1\* 12/2021   Kato ................... H10D 64/117
2022/0059649 A1    2/2022   Zaima et al.
2022/0123135 A1\*   4/2022   Smith ............... H10D 30/4755

FOREIGN PATENT DOCUMENTS

| JP | 2011-166052 A | 8/2011 |
| JP | 2014-135476 A | 7/2014 |
| JP | 2021034523 A | 3/2021 |
| JP | 2022034808 A | 3/2022 |

\* cited by examiner

SEMICONDUCTOR DEVICE AND METHOD FOR MANUFACTURING THE SAME

CROSS-REFERENCE TO RELATED APPLICATIONS

This application is based upon and claims the benefit of priority from Japanese Patent Application No. 2022-142425, filed on Sep. 7, 2022; the entire contents of which are incorporated herein by reference.

FIELD

Embodiments of described herein generally relate to a semiconductor device and a method for manufacturing the same.

BACKGROUND

For example, stable characteristics are desired in semiconductor devices such as transistors.

DETAILED DESCRIPTION

Figure 1:
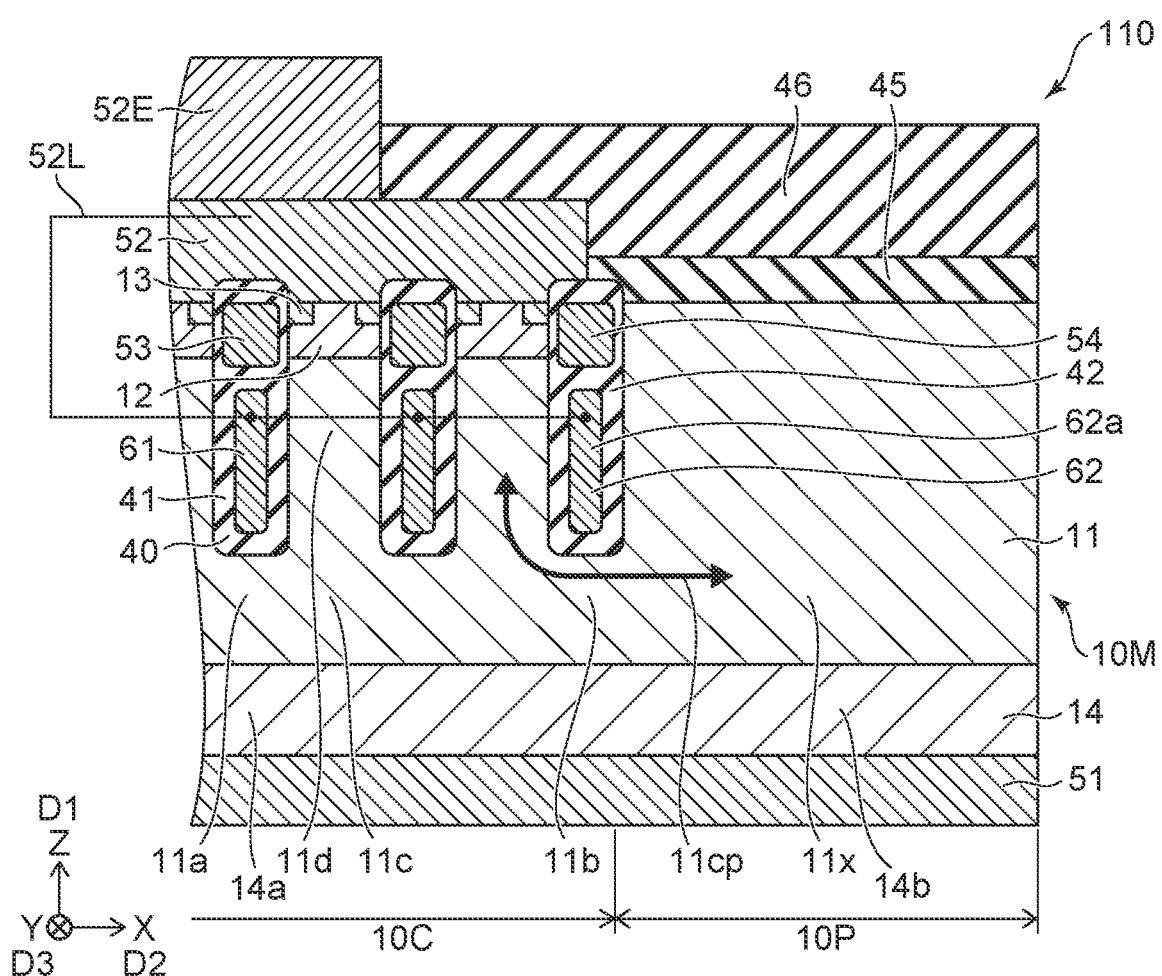
FIG. 1 is a schematic cross-sectional view illustrating a semiconductor device according to a first embodiment.

According to one embodiment, a semiconductor device includes a first electrode, a second electrode, a third electrode; a fourth electrode, a semiconductor member, a first conductive member, a second conductive member, and an insulating member. A direction from the first electrode to the second electrode is along a first direction. The semiconductor member includes a first semiconductor region, a second semiconductor region and a third semiconductor region. The semiconductor member is provided between the first electrode and the second electrode. The first semiconductor region includes a first outer edge region, a first partial region, a second partial region, a third partial region, and a fourth partial region. The second partial region is located between the first partial region and the first outer edge region in a second direction crossing the first direction. The third partial region is located between the first partial region and the second partial region in the second direction. The fourth partial region is located between the third partial region and a part of the second electrode in the first direction. The first partial region, the third partial region, and the fourth partial region are of a first conductivity type. A direction from the first partial region to the third electrode is along the first direction. A direction from the second partial region to the fourth electrode is along the first direction. The second semiconductor region is of a second conductivity type. The second semiconductor region is provided between the fourth partial region and the part of the second electrode in the first direction. The second semiconductor region is located between the third electrode and the fourth electrode in the second direction. The third semiconductor region is of the first conductivity type. The third semiconductor region is provided between the second semiconductor region and the part of the second electrode. The third semiconductor region is electrically connected to the second electrode. The first conductive member is provided between the first partial region and the third electrode in the first direction. The first conductive member is electrically connected to the second electrode. The second conductive member includes a first conductive portion. The first conductive portion is located between the second partial region and the fourth electrode in the first direction. The second conductive member is electrically connected to the second electrode. The insulating member includes a first insulating region and a second insulating region. The first insulating region is provided between the semiconductor member and the third electrode, between the semiconductor member and the first conductive member, and between the first conductive member and the third electrode. The second insulating region is provided between the semiconductor member and the fourth electrode, between the semiconductor member and the second conductive member, and between the second conductive member and the fourth electrode. An electrical resistivity of the second partial region is higher than an electrical resistivity of the first partial region.

Embodiments of the present invention will now be described with reference to the drawings.

The drawings are schematic or conceptual, and the relationship between the thickness and width of the respective portions, the ratio of the sizes between the portions, and the like are not necessarily the same as the actual ones. Even when the same part is represented, the dimensions and proportions of each other may be represented differently depending on the drawings.

In the specification of the present application and each of the figures, elements similar to those described above with respect to the previously described figures are denoted by the same reference numerals and a detailed description thereof is omitted as appropriate.

First Embodiment

FIG. 1 is a schematic cross-sectional view illustrating a semiconductor device according to a first embodiment.

Figure 2A:
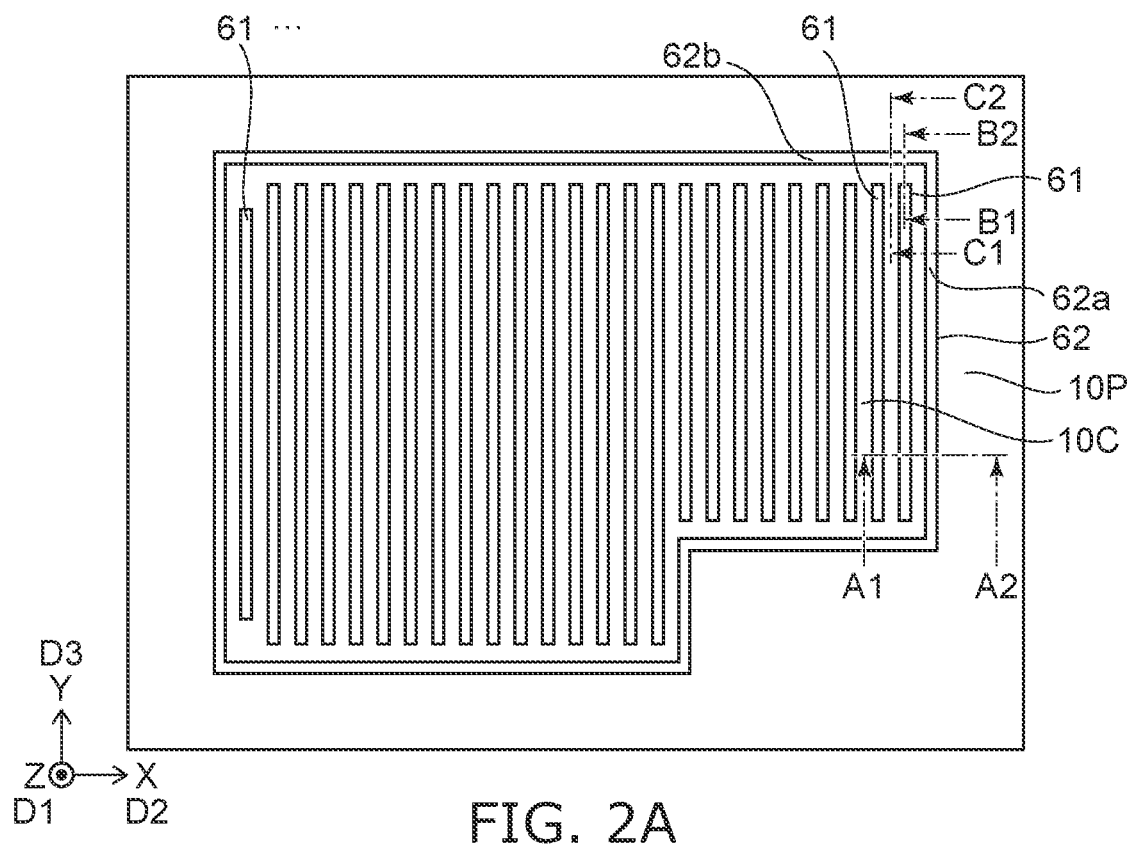
FIGS. 2A and 2B are schematic plan views illustrating the semiconductor device according to the first embodiment.
Figure 2B:
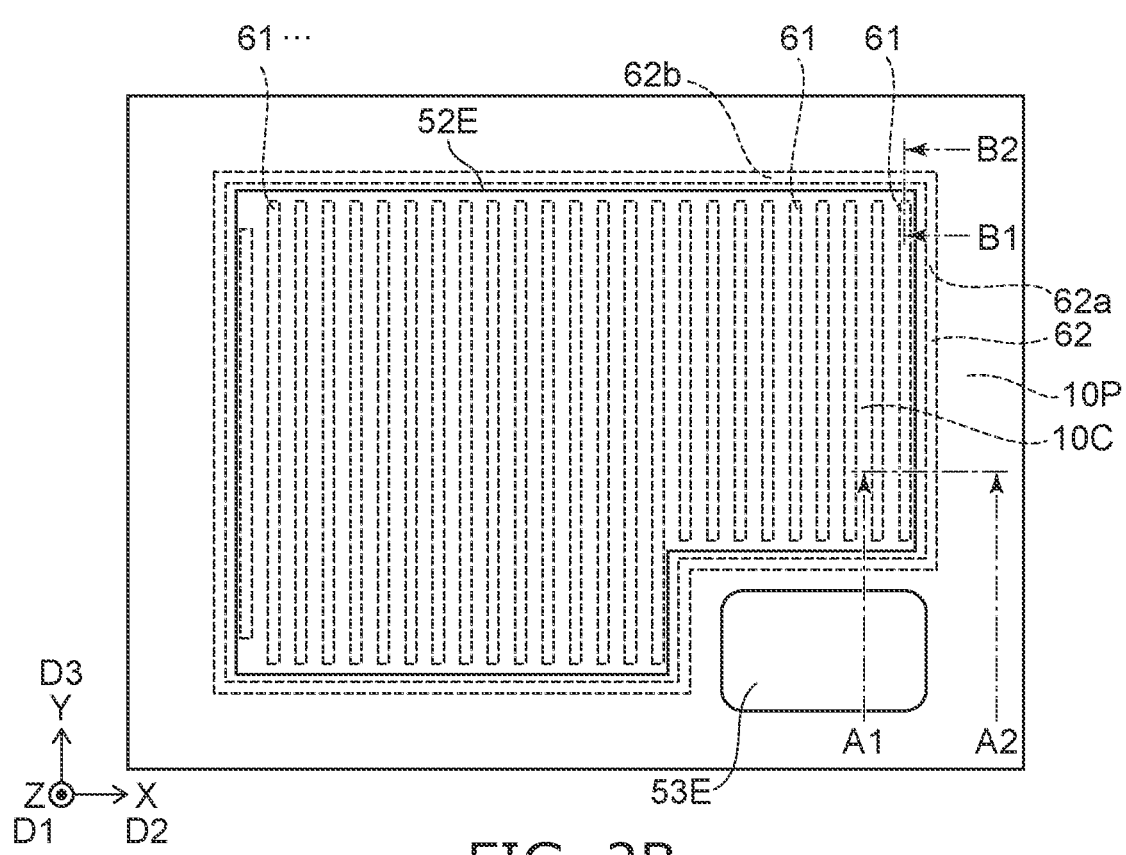

FIGS. 2A and 2B are schematic plan views illustrating the semiconductor device according to the first embodiment.

Figure 3A:
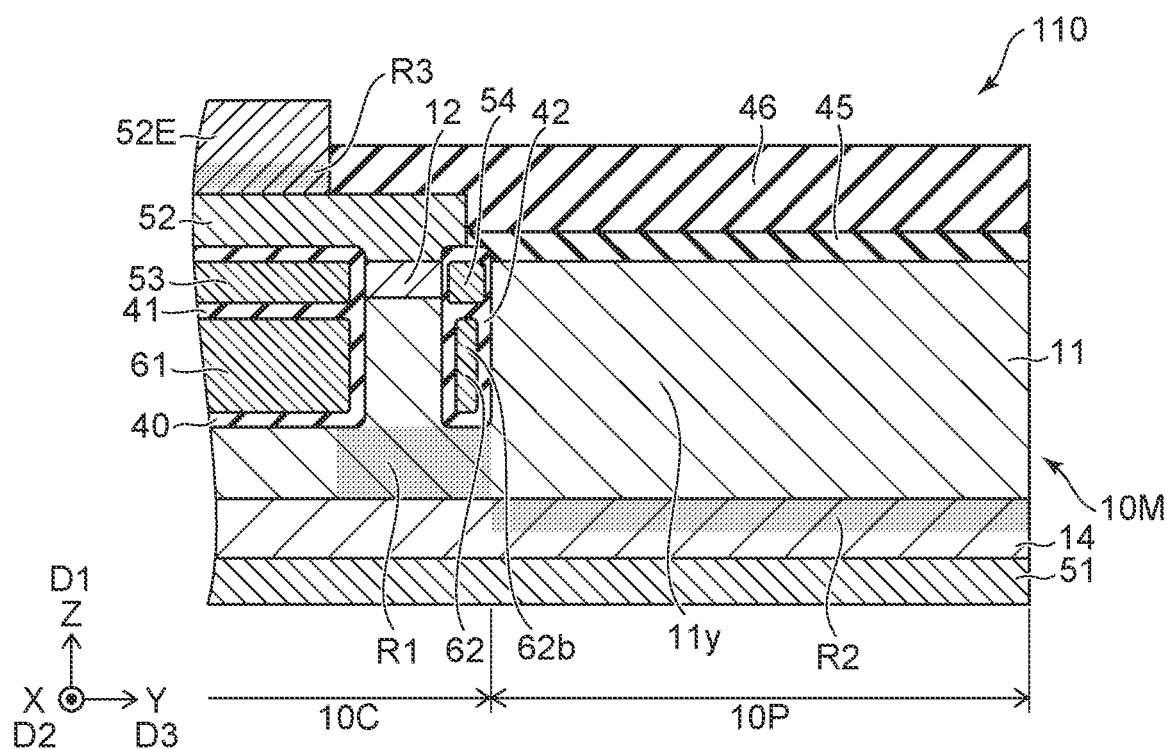
FIGS. 3A and 3B are schematic cross-sectional views illustrating the semiconductor device according to the first embodiment.
Figure 3B:
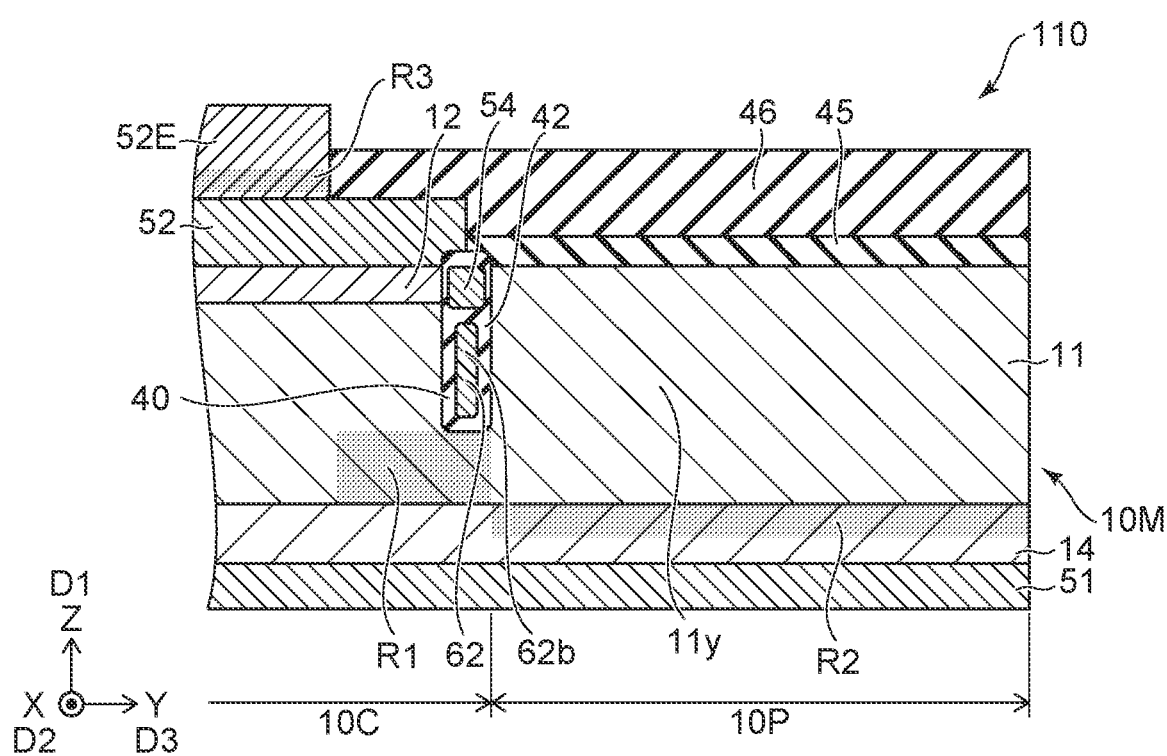

FIGS. 3A and 3B are schematic cross-sectional views illustrating the semiconductor device according to the first embodiment.

FIG. 1 is a cross-sectional view taken along the line A1-A2 in FIGS. 2A and 2B. FIG. 3A is a cross-sectional view along the line B1-B2 of FIGS. 2A and 2B. FIG. 3B is a sectional view taken along the line C1-C2 of FIG. 2A. Some of the members are omitted in FIGS. 2A and 2B.

As shown in FIG. 1, a semiconductor device 110 according to the embodiment includes a first electrode 51, a second electrode 52, a third electrode 53, a fourth electrode 54, a semiconductor member 10M, a first conductive member 61 and a second conductive member 62, and an insulating member 40.

A direction from the first electrode 51 to the second electrode 52 is along a first direction D1. The first direction D1 is defined as a Z-axis direction. One direction perpendicular to the Z-axis direction is defined as an X-axis direction. The direction perpendicular to the Z-axis direction and the X-axis direction is defined as a Y-axis direction.

The semiconductor member 10M is provided between the first electrode 51 and the second electrode 52. The semiconductor member 10M includes silicon, for example. The semiconductor member 10M may include, for example, at least one selected from the group consisting of SiC, GaN, $Ga_2O_3$, AlN and diamond. The semiconductor member 10M includes a first semiconductor region 11, a second semiconductor region 12, and a third semiconductor region 13.

The first semiconductor region 11 includes a first outer edge region 11x, a first partial region 11a, a second partial region 11b, a third partial region 11c and a fourth partial region 11d.

The second partial region 11b is located between the first partial region 11a and the first outer edge region 11x in a second direction D2. The second direction D2 crosses the first direction D1. The second direction D2 is, for example, the X-axis direction.

The third partial region 11c is located between the first partial region 11a and the second partial region 11b in the second direction D2. The fourth partial region 11d is located between the third partial region 11c and a part of the second electrode 52 in the first direction D1.

The first partial region 11a, the third partial region 11c, and the fourth partial region 11d are of a first conductivity type. The first conductivity type is, for example, n-type. The first partial region 11a, the third partial region 11c and the fourth partial region 11d are, for example, n-regions. The second partial region 11b may be of the first conductivity type.

A direction from the first partial region 11a to the third electrode 53 is along the first direction D1. A direction from the second partial region 11b to the fourth electrode 54 is along the first direction D1.

The second semiconductor region 12 is of a second conductivity type. The second conductivity type is, for example, p-type. The second semiconductor region 12 is provided between the fourth partial region 11d and the part of the second electrode 52 in the first direction D1. The second semiconductor region 12 is between the third electrode 53 and the fourth electrode 54 in the second direction D2.

The third semiconductor region 13 is of the first conductivity type (for example, n-type). The third semiconductor region 13 is provided between the second semiconductor region 12 and the part of the second electrode 52. The third semiconductor region 13 is electrically connected to the second electrode 52. At least a part of the third semiconductor region 13 may be provided between the third electrode 53 and the fourth electrode 54 in the second direction D2.

The first conductive member 61 is provided between the first partial region 11a and the third electrode 53 in the first direction D1. The first conductive member 61 is electrically connected to the second electrode 52.

The second conductive member 62 includes a first conductive portion 62a. The first conductive portion 62a is located between the second partial region 11b and the fourth electrode 54 in the first direction D1. The second conductive member 62 is electrically connected to the second electrode 52.

For example, the first conductive member 61 and the second conductive member 62 are electrically connected to the second electrode 52 by the connecting member 52L.

The insulating member 40 includes a first insulating region 41 and a second insulating region 42. The first insulating region 41 is provided between the semiconductor member 10M and the third electrode 53, between the semiconductor member 10M and the first conductive member 61, and between the first conductive member 61 and the third electrode 53.

The second insulating region 42 is provided between the semiconductor member 10M and the fourth electrode 54, between the semiconductor member 10M and the second conductive member 62, and between the second conductive member 62 and the fourth electrode 54. For example, a part of the second insulating region 42 is provided between the first conductive portion 62a and the fourth electrode 54.

For example, a current flowing between the first electrode 51 and the second electrode 52 can be controlled by a potential of the third electrode 53. The current may be controlled by a potential of the fourth electrode 54. The first electrode 51 is, for example, a drain electrode. The second electrode 52 is, for example, a source electrode. The third electrode 53 and the fourth electrode 54 are, for example, gate electrodes. The semiconductor device 110 is, for example, a transistor.

The first conductive member 61 and the second conductive member 62 function, for example, as field plates. By providing these conductive members, local concentration of the electric field is suppressed. A more stable operation is obtained.

As shown in FIGS. 1, 2A and 2B, the semiconductor member 10M (or semiconductor device 110) includes an inner region 10C and an outer region 10P. In the X-Y plane, the outer region 10P is provided around the inner region 10C. The inner region 10C is, for example, an active region.

As shown in FIG. 1, the first outer edge region 11x is included in the outer region 10P. The second partial region 11b is, for example, located between the third partial region 11c and the first outer edge region 11x. The second partial region 11b is, for example, the closest in the first semiconductor region 11 to the first outer edge region 11x. The second partial region 11b is, for example, the outermost part of the inner region 10C.

The fourth electrode 54 corresponds to, for example, the outermost gate electrode. The third electrode 53 corresponds to the inner gate electrode.

As shown in FIG. 2A, a plurality of first conductive members 61 may be provided. The third electrode 53 is provided corresponding to each of the plurality of first conductive members 61. As shown in FIG. 2A, for example, the second conductive member 62 is provided around the plurality of first conductive members 61.

In the embodiment, the electrical resistivity of the second partial region 11b is higher than the electrical resistivity of the first partial region 11a.

For example, in the operation of the semiconductor device 110, the temperature may increase excessively at the outermost periphery of the inner region 10C. Excessive temperature increase is considered to be caused by local current flow in the outermost circumference of the inner region 10C in the switching operation. For example, current (e.g., hole current) flows along the current path 11cp between the first outer edge region 11x and the second electrode 52 in the switching operation. The current path 11cp includes the second partial region 11b being the outermost. The electrical current locally increases the temperature of the outermost circumference of the inner region 10C. This causes, for example, thermal destruction.

In the embodiment, the electrical resistivity of the second partial region 11b is higher than the electrical resistivity of the first partial region 11a. As a result, the above current is suppressed. This suppresses the local temperature increase. For example, thermal destruction is suppressed. According to the embodiments, it is possible to provide a semiconductor device capable of obtaining stable characteristics.

In the embodiment, the electrical resistivity of the first partial region 11a is lower than the electrical resistivity of the second partial region 11b. This provides a low on-resistance. For example, when turned on, a large current can be obtained. According to the embodiment, it is possible to suppress temperature increase in the outermost circumference of the cell in the switching while obtaining a low on-resistance. For example, highly reliable power semiconductors can be provided.

In the embodiments, the electrical resistivity of the second partial region 11b may be higher than the electrical resistivity of the first outer edge region 11x.

In the embodiment, information on the electrical resistivity can be obtained, for example, from the results of detecting electrical resistance by contacting a target region with a probe in a cross section of the semiconductor device.

As shown in FIG. 1, the semiconductor member 10M may include a fourth semiconductor region 14. The fourth semiconductor region 14 is provided between the first electrode 51 and the first semiconductor region 11. The fourth semiconductor region 14 is of the first conductivity type (e.g., n-type). A carrier concentration of the first conductivity type in the fourth semiconductor region 14 is higher than a carrier concentration of the first conductivity type in the first partial region 11a. The fourth semiconductor region 14 is, for example, an $n_+$-region. A good electrical connection with the first electrode 51 is obtained by providing the fourth semiconductor region 14.

The fourth semiconductor region 14 includes a first semiconductor portion 14a and a second semiconductor portion 14b. The first semiconductor portion 14a is located between the first electrode 51 and the first partial region 11a in the first direction D1. The second semiconductor portion 14b is located between the first electrode 51 and the first outer edge region 11x in the first direction D1.

In the embodiment, the electrical resistivity of the second semiconductor portion 14b may be higher than the electrical resistivity of the first semiconductor portion 14a. The first semiconductor portion 14a corresponds to the inner region 10C. The second semiconductor portion 14b corresponds to the outer region 10P. The low electrical resistivity of the first semiconductor portion 14a corresponding to the inner region 10C provides, for example, a low on-resistance.

As shown in FIG. 1, the semiconductor device 110 may further include an electrode layer 52E. The electrode layer 52E is electrically connected to the second electrode 52. At least a part of the second electrode 52 is located between the semiconductor member 10M and the electrode layer 52E in the first direction D1. The electrode layer 52E is, for example, a source electrode pad.

As shown in FIG. 1, for example, the electrode layer 52E overlaps the first partial region 11a in the first direction D1. For example, the electrode layer 52E does not overlap the second partial region 11b. As will be described later, the first element may be introduced into the semiconductor member 10M using the electrode layer 52E as a mask. Thereby, the first partial region 11a and the second partial region 11b having different electrical resistivities may be formed.

The second electrode 52 includes, for example, aluminum. The electrode layer 52E includes nickel, for example. The thickness of the electrode layer 52E may be thicker than the thickness of the second electrode 52. The electrode layer 52E may be formed by, for example, plating.

As shown in FIG. 1, in the outer region 10P, an insulating film 45 may be provided on the semiconductor member 10M. The insulating film 45 includes, for example, silicon oxide. An insulating film 46 may be provided on the insulating film 45. The insulating film 46 includes, for example, resin (e.g., polyimide, etc.). These insulating films function, for example, as protective films.

As shown in FIG. 2A, the first conductive member 61 extends along a third direction D3. The third direction D3 crosses a plane including the first direction D1 and the second direction D2. The third direction D3 is, for example, the Y-axis direction. As shown in FIG. 2A, the second conductive member 62 may include a second conductive portion 62b.

As shown in FIGS. 3A and 3B, the first semiconductor region 11 includes a second outer edge region 11y. The second outer edge region 11y corresponds to the outer region 10P. The second conductive portion 62b is located between the first conductive member 61 and the second outer edge region 11y in the third direction D3.

As shown in FIG. 1, the first conductive member 61 and the second conductive member 62 are electrically connected to the second electrode 52 by the connecting member 52L.

As shown in FIG. 2A, the plurality of first conductive members 61 extend along the third direction D3. The plurality of first conductive members 61 may be provided between multiple portions of the second conductive member 62. The second conductive member 62 is provided around the first conductive member 61 on a plane crossing the first direction D1 (for example, the X-Y plane). For example, the second conductive member 62 surrounds the plurality of first conductive members 61 on the plane crossing the first direction D1 (for example, the X-Y plane).

As shown in FIG. 2, a third electrode layer 53E may be provided. The third electrode layer 53E is electrically connected to the third electrode 53 and the fourth electrode 54. As shown in FIG. The third electrode layer 53E is, for example, a gate electrode pad.

The first partial region 11a and the second partial region 11b having different electrical resistivities may be formed by various methods.

Figure 4:
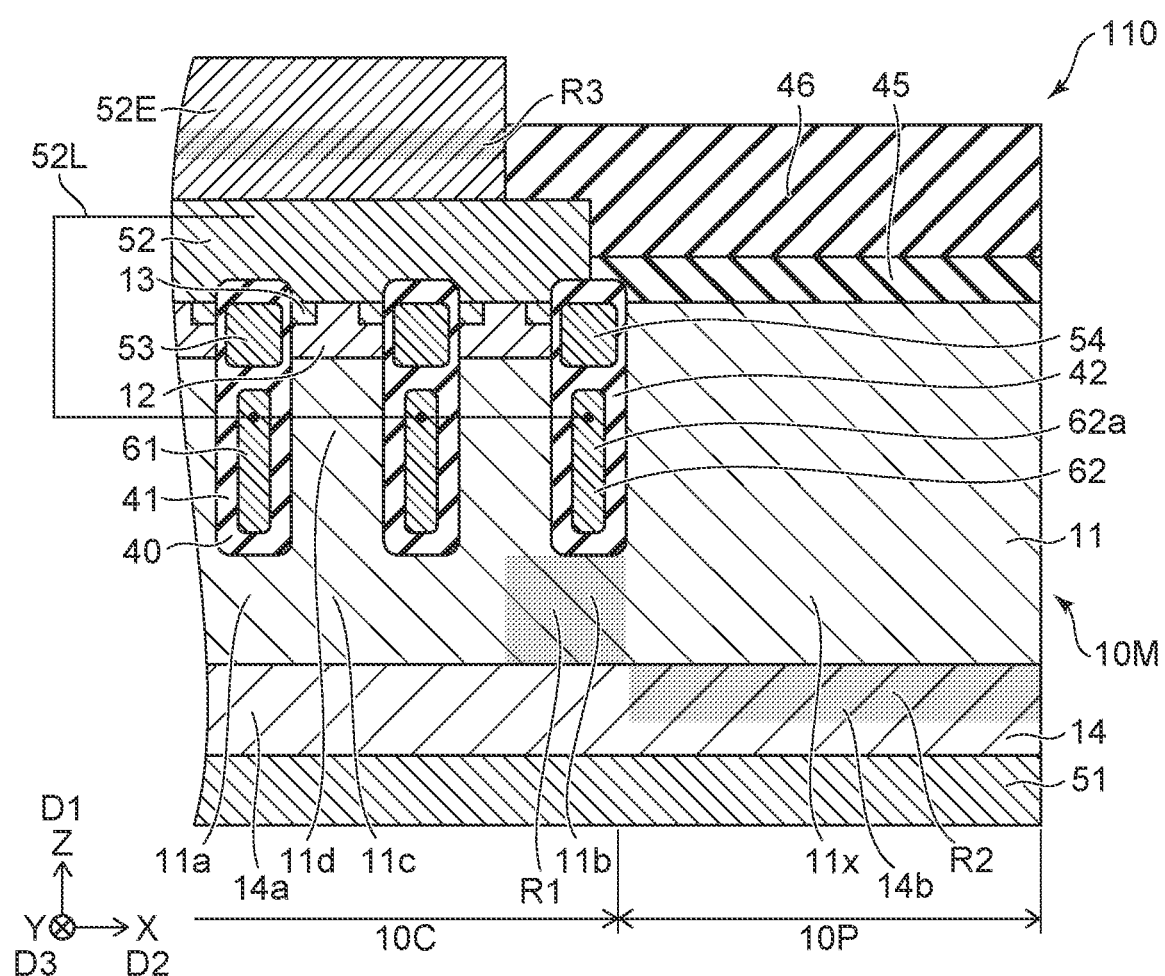
FIG. 4 is a schematic cross-sectional view illustrating the semiconductor device according to the first embodiment.

FIG. 4 is a schematic cross-sectional view illustrating the semiconductor device according to the first embodiment.

As shown in FIG. 4, the semiconductor member 10M may include a first region R1. In semiconductor device 110, at least a part of first region R1 is included in second partial region 11b.

The first region R1 includes a first element. The first element includes, for example, at least one selected from the group consisting of hydrogen, helium, and argon. The first partial region 11a does not substantially include the first element. By providing the first region R1 including the first element, the electrical resistivity of the second partial region 11b becomes higher than the electrical resistivity of the first partial region 11a.

Thus, the second partial region 11b includes the first element. The first partial region 11a does not include the first element. Alternatively, a concentration of the first element in the first partial region 11a is lower than a concentration of the first element in the second partial region 11b.

The concentration of the first element in the second partial region 11b may be higher than the concentration of the first element in the first outer edge region 11x.

As shown in FIG. 4, the semiconductor member 10M may include a second region R2. The second region R2 includes the first element. As already explained, the semiconductor member 10M may further include the fourth semiconductor region 14. The fourth semiconductor region 14 includes a first semiconductor portion 14a and a second semiconductor portion 14b. The first semiconductor portion 14a is located between the first electrode 51 and the first partial region 11a in the first direction D1. The second semiconductor portion 14b is located between the first electrode 51 and the first outer edge region 11x in the first direction D1. At least part of the second region R2 including the first element is included in the second semiconductor portion 14b.

The concentration of the first element in the second semiconductor portion 14b may be higher than the concentration of the first element in the first semiconductor portion 14a. A high electrical resistivity can be maintained in the first semiconductor portion 14a.

As shown in FIG. 4, the electrode layer 52E may include a third region R3. The third region R3 includes the first element. By providing the third region R3, for example, the interface of the second electrode 52 is affected, and termination at the interface is promoted, for example. By providing the third region R3, for example, deviation in characteristics of the semiconductor device is suppressed.

Information about the first element can be obtained by, for example, SIMS (Secondary Ion Mass Spectrometry) or EDX (Energy Dispersive X-ray Spectroscopy).

The first region R1 and the second region R2 may be regions with lower crystallinity than others. The low crystallinity causes the electrical resistivity in these regions to be higher than others.

For example, the crystallinity of the second partial region 11b is lower than the crystallinity of the first partial region 11a. For example, the crystallinity of the second partial region 11b may be lower than the crystallinity of the first outer edge region 11x.

For example, in the fourth semiconductor region 14, the second semiconductor portion 14b may have a lower crystallinity than the first semiconductor portion 14a.

Information on crystallinity can be obtained by, for example, TEM (Transmission Electron Microscope). Information about crystallinity can be obtained, for example, by X-ray diffraction.

In the semiconductor device 110 illustrated in FIGS. 1 and 4, the first conductive member 61 corresponding to the first partial region 11a having a low electrical resistivity may not be closest to the outermost conductive member (second conductive member 62) among the plurality of first conductive members 61.

Figure 5:
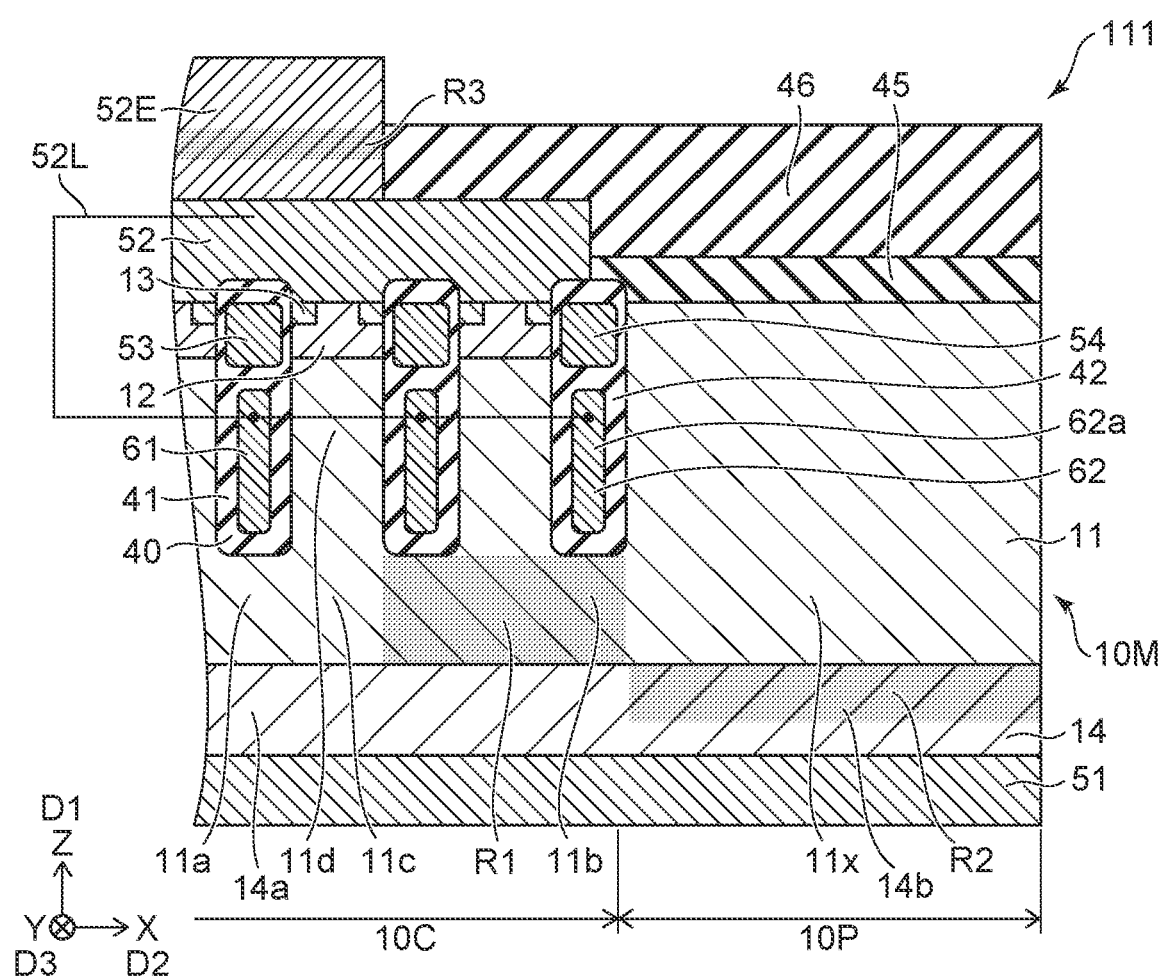
FIG. 5 is a schematic cross-sectional view illustrating a semiconductor device according to the first embodiment.

FIG. 5 is a schematic cross-sectional view illustrating a semiconductor device according to the first embodiment.

As shown in FIG. 5, in the semiconductor device 111 according to the embodiment, the first region R1 may be provided in the partial region corresponding to the conductive member closest to the outermost conductive member (the second conductive member 62). In this case, the first conductive member 61 corresponding to the first partial region 11a having a low electrical resistivity is not closest to the outermost conductive member (second conductive member 62). Other configurations of the semiconductor device 111 may be the same as those of the semiconductor device 110.

Figure 6:
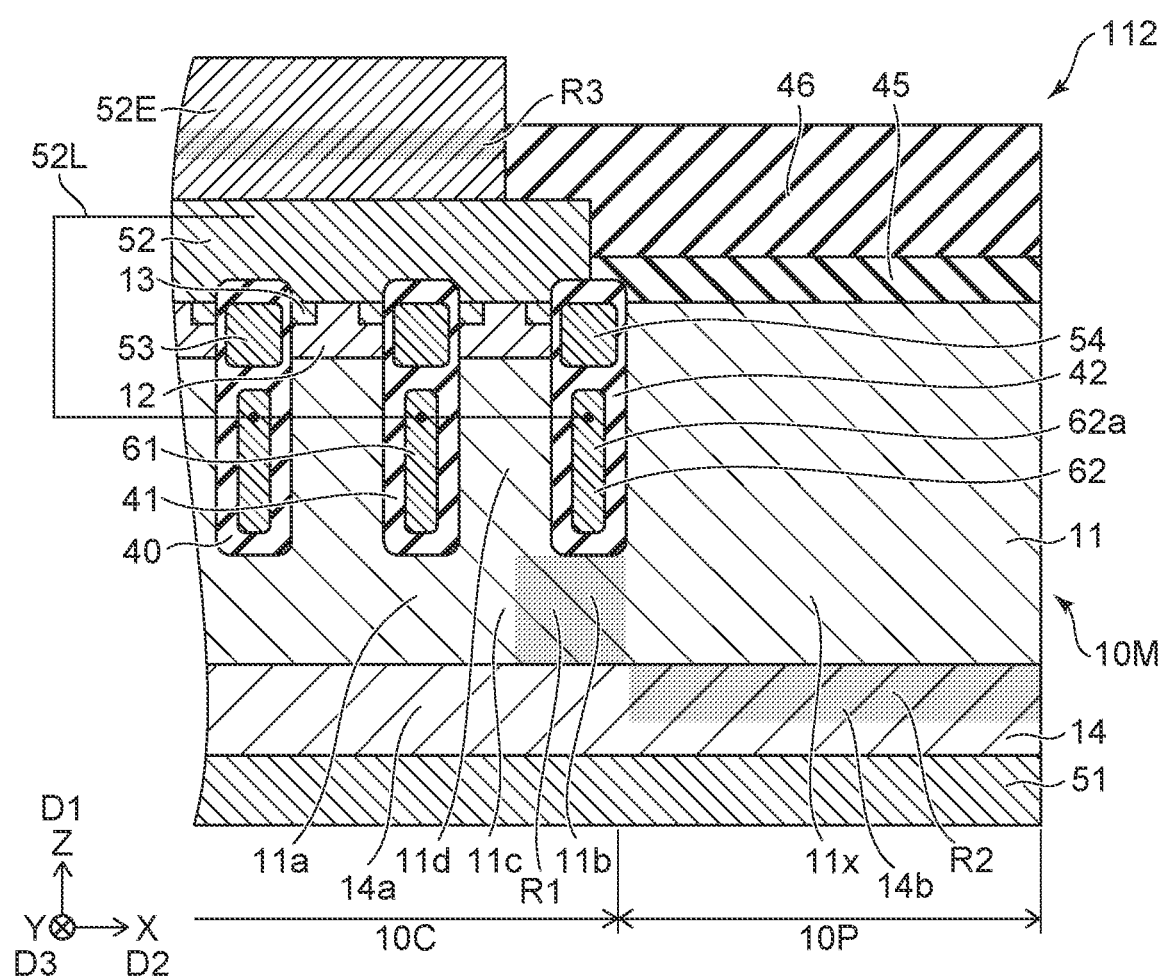
FIG. 6 is a schematic cross-sectional view illustrating a semiconductor device according to the first embodiment.

FIG. 6 is a schematic cross-sectional view illustrating a semiconductor device according to the first embodiment.

As shown in FIG. 6, in a semiconductor device 112 according to the embodiment, the conductive member closest to the outermost conductive member (second conductive member 62) corresponds to the first conductive member 61 corresponding to the first partial region 11a having the low electrical resistivity. The first region R1 is not provided in the first partial region 11a. Other configurations of the semiconductor device 112 may be the same as those of the semiconductor device 110.

Figure 7:
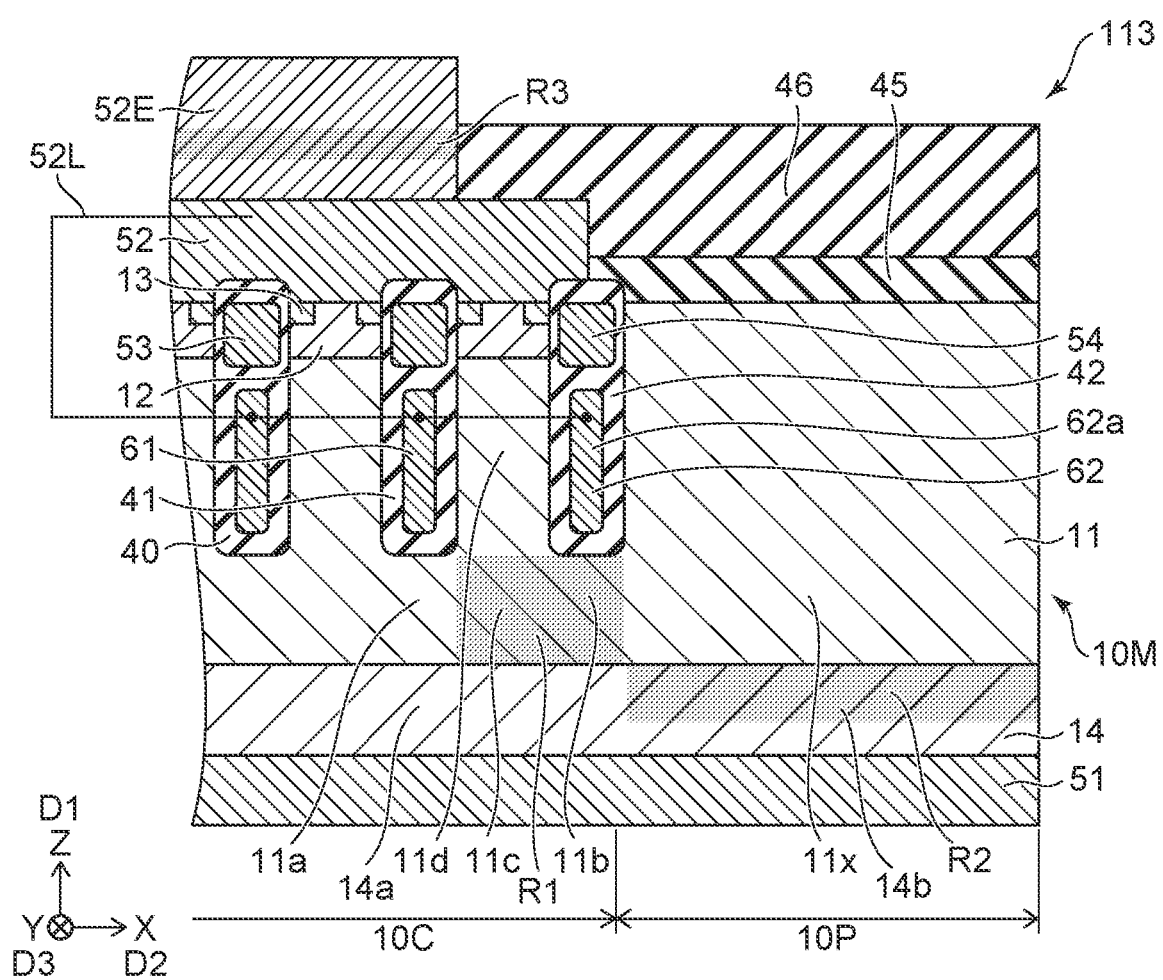
FIG. 7 is a schematic cross-sectional view illustrating a semiconductor device according to the first embodiment.

FIG. 7 is a schematic cross-sectional view illustrating a semiconductor device according to the first embodiment.

As shown in FIG. 7, in a semiconductor device 113 according to the embodiment, the first region R1 including the first element is also provided in the third partial region 11c. Other configurations of the semiconductor device 113 may be the same as those of the semiconductor device 110.

In the semiconductor device 113, the electrical resistivity of at least a part of the third partial region 11c may be higher than the electrical resistivity of the first partial region 11a. For example, the concentration of the first element in at least a part of the third partial region 11c may be higher than the concentration of the first element in the first partial region 11a. For example, the crystallinity of at least a part of the third partial region 11c may be lower than that of the first partial region 11a.

Figure 8:
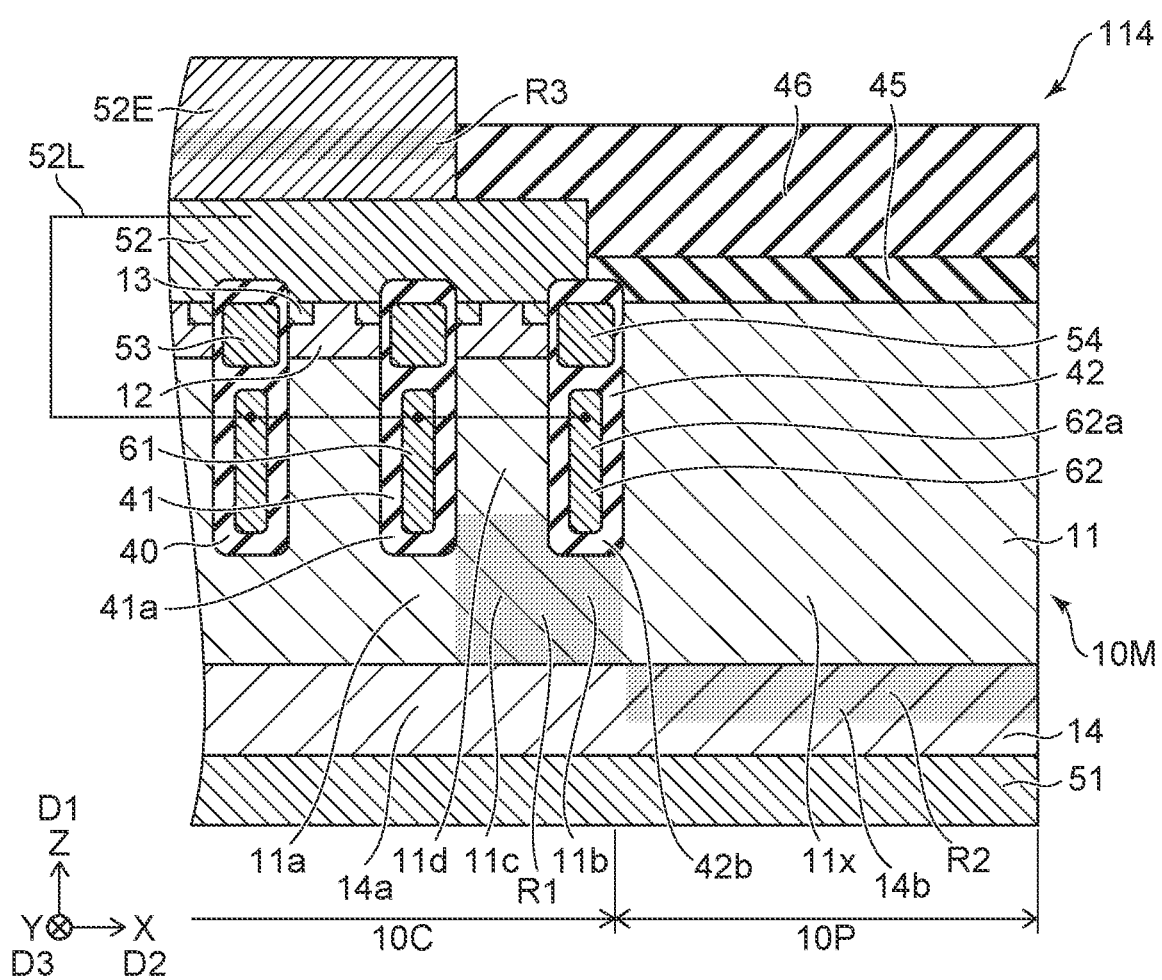
FIG. 8 is a schematic cross-sectional view illustrating a semiconductor device according to the first embodiment.

FIG. 8 is a schematic cross-sectional view illustrating a semiconductor device according to the first embodiment.

As shown in FIG. 8, in a semiconductor device 114 according to the embodiment, the shape of the first region R1 is different from the shape of the first region R1 in the semiconductor device 113. Other configurations of the semiconductor device 114 may be the same as those of the semiconductor device 113.

As shown in FIG. 8, the first insulating region 41 includes the first insulating portion 41a. The first insulating portion 41a is located between the first partial region 11a and the first conductive member 61 in the first direction D1. The second insulating region 42 includes a second insulating portion 42b. The second insulating portion 42b is located between the second partial region 11b and the second conductive member 62 in the first direction D1. A part of the first region R1 including the first element may be located between the first insulating portion 41a and the second insulating portion 42b. A part of the first region R1 may be located between the first conductive member 61 and the second conductive member 62.

In the semiconductor device 114, at least a part of the third partial region 11c (a part having a higher electrical resistivity than that of the first partial region 11a) may be located between the first insulating portion 41a and the second insulating portion 42b. At least a part of the third partial region 11c (a part having a higher electrical resistivity than that of the first partial region 11a) may be located between the first conductive member 61 and the second conductive member 62.

At least a part of the third partial region 11c (a part having a higher concentration of the first element than the first partial region 11a) may be located between the first insulating portion 41a and the second insulating portion 42b. At least a part of the third partial region 11c (a part having a higher concentration of the first element than that of the first partial region 11a) may be located between the first conductive member 61 and the second conductive member 62.

At least a part of the third partial region 11c (a part having a lower crystallinity than the first partial region 11a) may be located between the first insulating portion 41a and the second insulating portion 42b. At least a part of the third partial region 11c (a part having a lower crystallinity than the first partial region 11a) may be located between the first conductive member 61 and the second conductive member 62.

Figure 9:
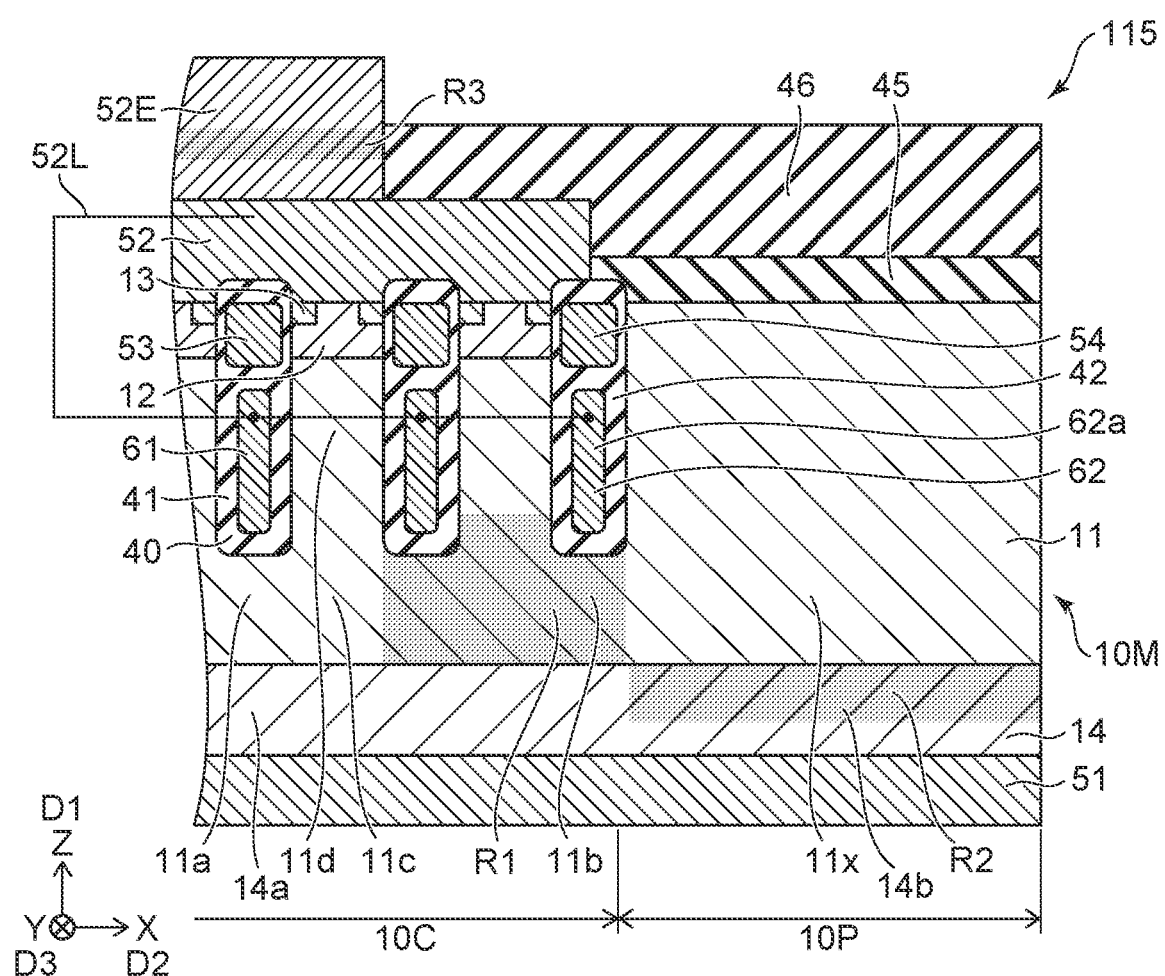
FIG. 9 is a schematic cross-sectional view illustrating a semiconductor device according to the first embodiment.

FIG. 9 is a schematic cross-sectional view illustrating a semiconductor device according to the first embodiment.

As shown in FIG. 9, in a semiconductor device 115 according to the embodiment, the shape of the first region R1 is different from the shape of the first region R1 in the semiconductor device 114. Other configurations of the semiconductor device 115 may be the same as those of the semiconductor device 114.

In the semiconductor device 115, the first region R1 including the first element is provided at least in a part of the region between the first electrode 51 and the conductive member being second from the outside.

Also in the semiconductor devices 111 to 115, the local temperature increase is suppressed. Thermal destruction is suppressed. A semiconductor device capable of obtaining stable characteristics can be provided. For example, it is possible to suppress temperature increase in the outermost circumference of the cell in the switching while obtaining a low on-resistance. For example, highly reliable power semiconductors can be provided.

Figure 10A:
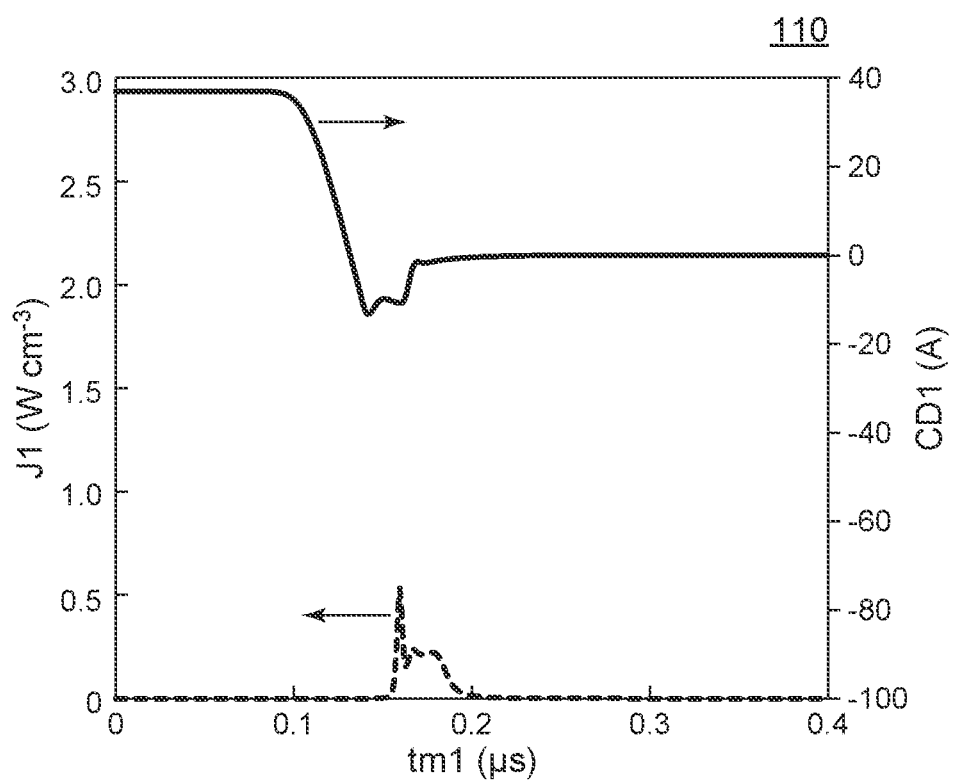
FIGS. 10A and 10B are graphs illustrating the characteristics of semiconductor devices.
Figure 10B:
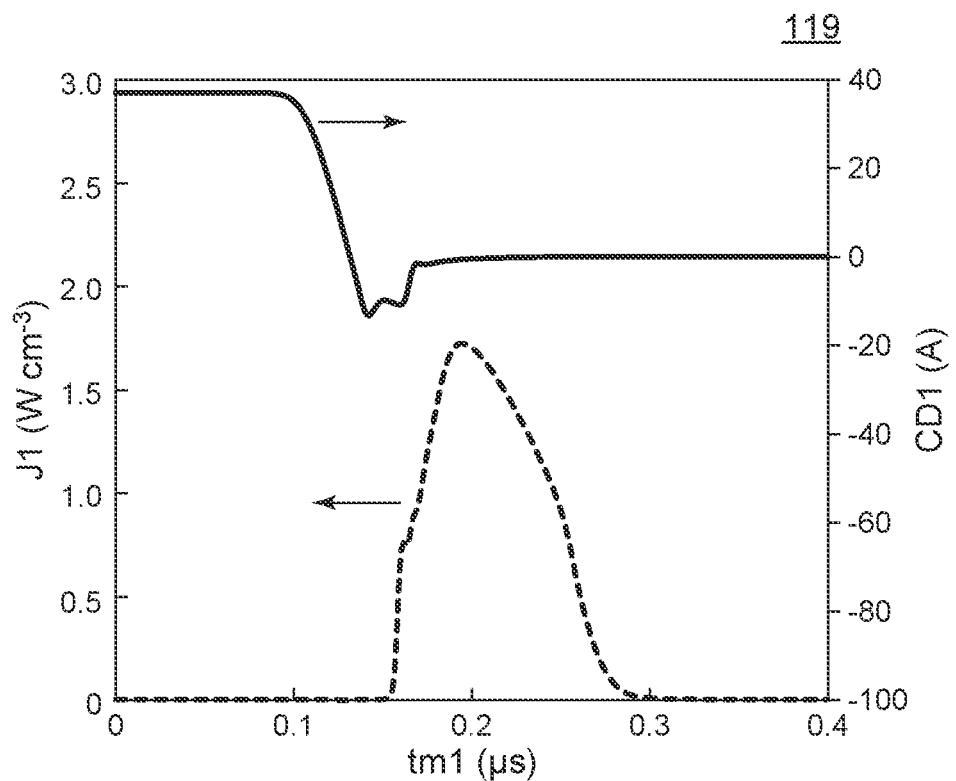

FIGS. 10A and 10B are graphs illustrating the characteristics of semiconductor devices.

FIG. 10A corresponds to the semiconductor device 110 according to the embodiment. As already described, in the semiconductor device 110, the electrical resistivity of the second partial region 11b is higher than the electrical resistivity of the first partial region 11a. In this example, the electrical resistivity of the second partial region 11b is ten times the electrical resistivity of the first partial region 11a. FIG. 10B corresponds to a semiconductor device 119 of a reference example. In semiconductor device 119, the electrical resistivity of second partial region 11b is the same as the electrical resistivity of first partial region 11a. The horizontal axis of these figures is time tm1. The switching start time tm1 is set to be 0 μs. The vertical axis on the left side of these figures is the amount of heat generated 31 in the vicinity of the lower corner portion of the second conductive member 62. The vertical axis on the right of these figures is the drain current CD1.

As shown in FIGS. 10A and 10B, the semiconductor devices 110 and 119 have substantially the same drain current CD1. As shown in FIG. 10B, in the semiconductor device 119, the amount of heat generated 31 is large. In contrast, in the semiconductor device 110, the amount of heat generated 31 is significantly reduced. According to the embodiment, the local temperature increase is suppressed. Thermal destruction is suppressed.

Figure 11:
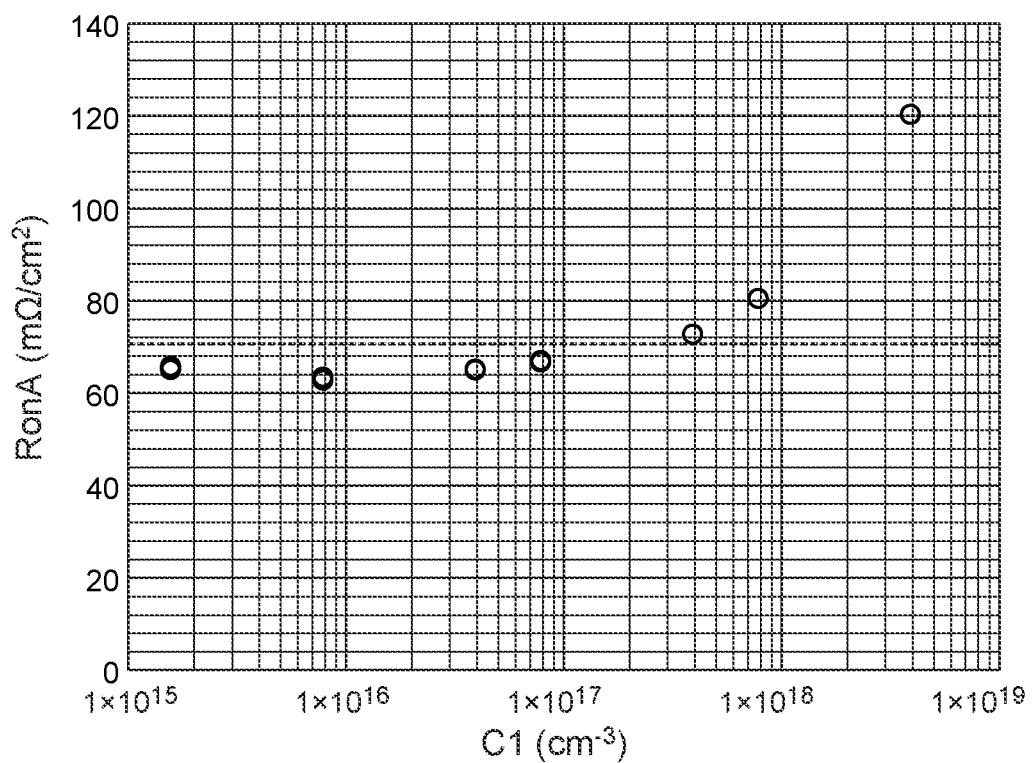
FIG. 11 is a graph illustrating characteristics of a semiconductor device.

FIG. 11 is a graph illustrating characteristics of a semiconductor device.

FIG. 11 illustrates the on-resistance RonA when hydrogen is introduced into the first semiconductor region 11 in the structure of the semiconductor device 110. The horizontal axis of FIG. 11 is the concentration C1 of hydrogen. The vertical axis is the on-resistance RonA. In this example, the on-resistance RonA of the sample to which hydrogen is not introduced is 70 mΩ/cm². Hydrogen may be introduced by introducing protons. As shown in FIG. 11, by changing the concentration C1 of hydrogen, the on-resistance RonA is changed. For example, at a concentration C1 of hydrogen greater than about $2 \times 10^{17}$ cm$^{-3}$, a higher on-resistance RonA is obtained than when no hydrogen is introduced. For example, when the electrical resistivity is controlled by introducing hydrogen, the concentration C1 of hydrogen may be, for example, $2 \times 10^{17}$ cm$^{-3}$ or more. When the electrical resistivity is controlled, the concentration C1 of hydrogen may be, for example, $1 \times 0^{18}$ cm$^{-3}$ or more.

In the embodiments, the second partial region 11b may include an impurity of the second conductivity type. The first partial region 11a includes substantially no impurities of the second conductivity type. For example, the second partial region 11b includes an impurity of the first conductivity type and an impurity of the second conductivity type. The first partial region 11a contains an impurity of the first conductivity type and substantially does not include an impurity of the second conductivity type. For example, the concentration of the impurity of the second conductivity type in the second partial region 11b is higher than the concentration of the impurity of the second conductivity type in the first partial region 11a. As a result, the electrical resistivity of the second partial region 11b becomes higher than the electrical resistivity of the first partial region 11a. The local temperature increase is suppressed.

Second Embodiment

The second embodiment relates to a method for manufacturing a semiconductor device.

Figure 12:
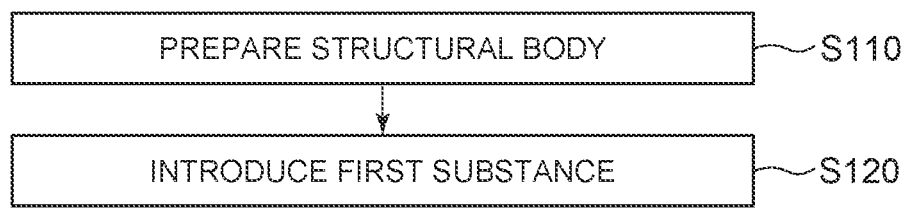
FIG. 12 is a flowchart illustrating a method for manufacturing the semiconductor device according to a second embodiment.

FIG. 12 is a flowchart illustrating a method for manufacturing the semiconductor device according to the second embodiment.

Figure 13:
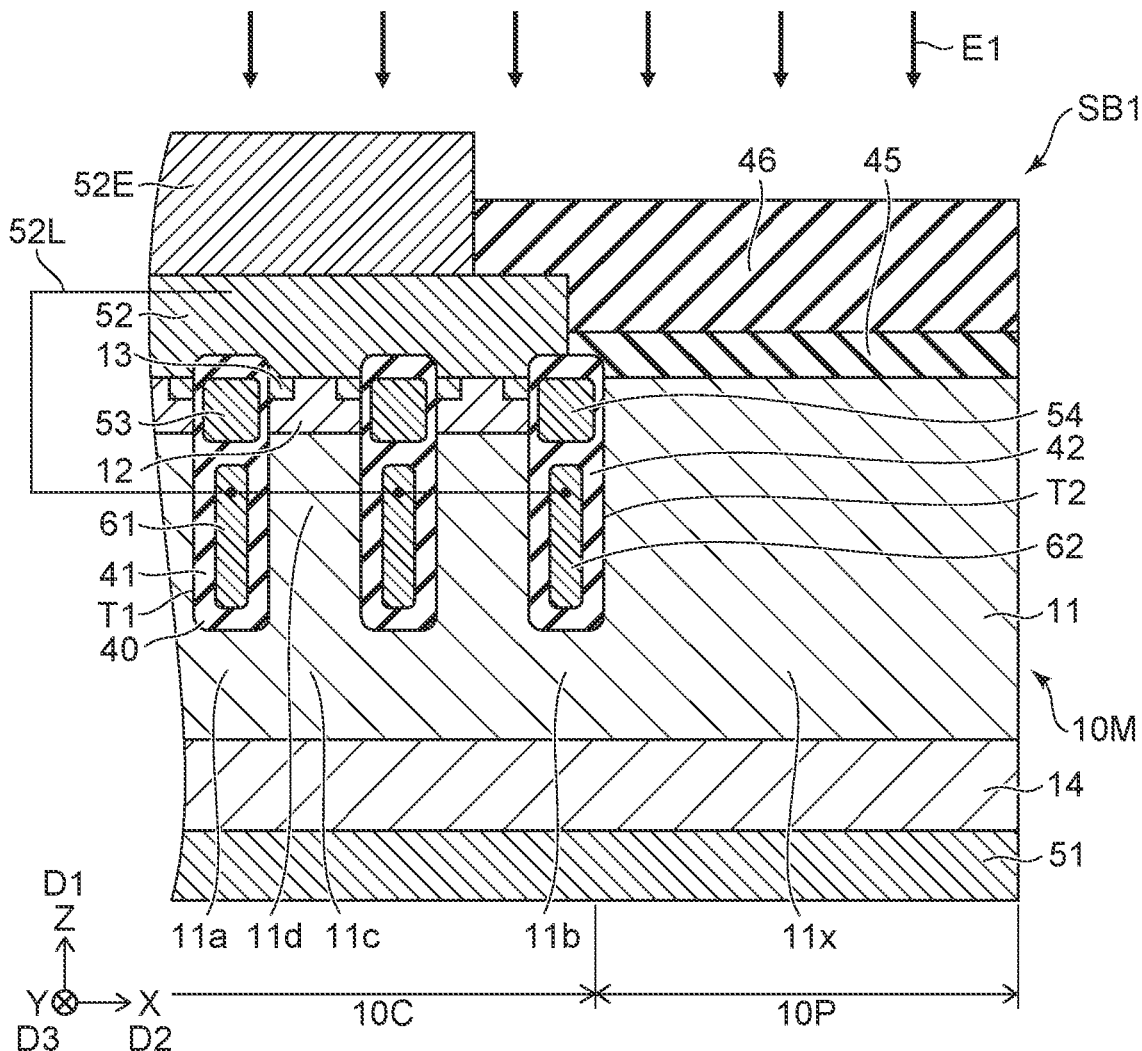
FIG. 13 is a schematic cross-sectional view illustrating the method for manufacturing the semiconductor device according to the second embodiment.

FIG. 13 is schematic cross-sectional views illustrating the method for manufacturing the semiconductor device according to the second embodiment.

As shown in FIG. 12, the method for manufacturing the semiconductor device according to the embodiment includes preparing a structural body (step S110) and introducing a first substance (step S120). The first substance may correspond to the first element described above.

FIG. 13 illustrates the structural body SB1. The structural body SB1 includes the semiconductor member 10M, the third electrode 53, the fourth electrode 54, the first conductive member 61 and the second conductive member 62, the electrode layer 52E and the insulating member 40.

The semiconductor member 10M includes the outer region 10P and the inner region 10C. The outer region 10P is provided around the inner region 10C. The inner region 10C includes a first trench T1 and a second trench T2. The first conductive member 61 and the third electrode 53 are provided in the first trench T1 of the inner region 10C. The second conductive member 62 and the fourth electrode 54 are provided in the second trench T2 of the inner region 10C. The electrode layer 52E is provided above the third electrode 53. At least a part of the insulating member 40 is provided between the third electrode 53 and the electrode layer 52E.

The second trench T2 is located between the first trench T1 and the outer region 10P. The semiconductor member 10M includes the first semiconductor region 11. The first semiconductor region 11 includes the first partial region 11a and the second partial region 11b. The first conductive member 61 is located between the first partial region 11a and the third electrode 53 in the first direction D1 from the semiconductor member 10M to the electrode layer 52E. The second conductive member 62 is located between the second partial region 11b and the fourth electrode 54 in the first direction D1.

The electrode layer 52E overlaps the first conductive member 61 and the third electrode 53 in the first direction D1. The electrode layer 52E does not overlap the second conductive member 62 and the fourth electrode 54 in the first direction D1.

In the step S120, as shown in FIG. 13, the electrode layer 52E is used as a mask to introduce the first substance E1 into the second partial region 11b. The first substance E1 is not introduced into the first partial region 11a. Alternatively, by introducing the first substance E1, the concentration of the first substance E1 in the second partial region 11b is made higher than the concentration of the first substance E1 in the first partial region 11a. The first substance E1 includes, for example, at least one selected from the group consisting of protons, hydrogen, helium, and argon.

According to the method for manufacturing the semiconductor device according to the embodiment, a semiconductor device capable of obtaining stable characteristics can be manufactured by a simple process.

When the first substance E1 is a proton, the dose amount in the introduction of the first substance E1 is, for example, not less than $1\times10^{13}$ cm$^{-2}$ and not more than o $1\times10^{14}$ cm$^{-2}$ (for example, about $5\times10^{13}$ cm$^{-2}$). The energy is, for example, not less than 600 eV and not more than 800 eV.

After the introducing the first substance E1, heat treatment may be performed. In one example, in the heat treatment, the temperature is, for example, 350° C., the atmosphere is $N_2$, and the time is 60 minutes.

In the embodiments, the third electrode 53, the fourth electrode 54, the first conductive member 61 and the second conductive member 62 may include, for example, polysilicon. The first electrode 51 may include, for example, at least one selected from the group consisting of aluminum, nickel, titanium, silver and gold.

In the embodiments, information regarding length and thickness is obtained, by electron microscopy and the like. Information on the composition of materials can be obtained by SIMS (Secondary Ion Mass Spectrometry) or EDX (Energy dispersive X-ray spectroscopy).

Embodiments may include the following configurations (for example, technical proposals).

Configuration 1

A semiconductor device, comprising:
a first electrode;
a second electrode, a direction from the first electrode to the second electrode being along a first direction;
a third electrode;
a fourth electrode;
a semiconductor member, the semiconductor member including a first semiconductor region, a second semiconductor region and a third semiconductor region, the semiconductor member being provided between the first electrode and the second electrode,
the first semiconductor region including a first outer edge region, a first partial region, a second partial region, a third partial region, and a fourth partial region, the second partial region being located between the first partial region and the first outer edge region in a second direction crossing the first direction, the third partial region being located between the first partial region and the second partial region in the second direction, the fourth partial region being located between the third partial region and a part of the second electrode in the first direction, the first partial region, the third partial region, and the fourth partial region being of a first conductivity type, a direction from the first partial region to the third electrode being along the first direction, a direction from the second partial region to the fourth electrode being along the first direction, the second semiconductor region being of a second conductivity type, the second semiconductor region being provided between the fourth partial region and the part of the second electrode in the first direction, the second semiconductor region being located between the third electrode and the fourth electrode in the second direction, and the third semiconductor region being of the first conductivity type, the third semiconductor region being provided between the second semiconductor region and the part of the second electrode, the third semiconductor region being electrically connected to the second electrode;

a first conductive member provided between the first partial region and the third electrode in the first direction, the first conductive member being electrically connected to the second electrode;

a second conductive member including a first conductive portion, the first conductive portion being located between the second partial region and the fourth electrode in the first direction, the second conductive member being electrically connected to the second electrode; and an insulating member including a first insulating region and a second insulating region, the first insulating region being provided between the semiconductor member and the third electrode, between the semiconductor member and the first conductive member, and between the first conductive member and the third electrode, the second insulating region being provided between the semiconductor member and the fourth electrode, between the semiconductor member and the second conductive member, and between the second conductive member and the fourth electrode, an electrical resistivity of the second partial region being higher than an electrical resistivity of the first partial region.

Configuration 2

The semiconductor device according to Configuration 1, wherein the electrical resistivity of the second partial region is higher than an electrical resistivity of the first outer edge region.

Configuration 3

The semiconductor device according to Configuration 1 or 2, wherein
the semiconductor member further includes a fourth semiconductor region provided between the first electrode and the first semiconductor region,
the fourth semiconductor region is of the first conductivity type,
a carrier concentration of the first conductivity type in the fourth semiconductor region is higher than a carrier concentration of the first conductivity type in the first partial region,
the fourth semiconductor region includes a first semiconductor portion and a second semiconductor portion, the first semiconductor portion is located between the first electrode and the first partial region in the first direction, the second semiconductor portion is located between the first electrode and the first outer edge region in the first direction, and an electrical resistivity of the second semiconductor portion is higher than an electrical resistivity of the first semiconductor portion.

Configuration 4

The semiconductor device according to any one of Configurations 1 to 3, wherein an electrical resistivity of at least a part of the third partial region is higher than the electrical resistivity of the first partial region.

Configuration 5

The semiconductor device according to Configuration 4, wherein the first insulating region includes a first insulating portion, the first insulating portion is located between the first partial region and the first conductive member in the first direction, the second insulating region includes a second insulating portion, the second insulating portion is located between the second partial region and the second conductive member in the first direction, and at least a part of the third partial region is located between the first insulating portion and the second insulating portion.

Configuration 6

A semiconductor device, comprising:

a first electrode;

a second electrode, a direction from the first electrode to the second electrode being along a first direction;

a third electrode;

a fourth electrode;

a semiconductor member, the semiconductor member including a first semiconductor region, a second semiconductor region and a third semiconductor region, the semiconductor member being provided between the first electrode and the second electrode, the first semiconductor region including a first outer edge region, a first partial region, a second partial region, a third partial region, and a fourth partial region, the second partial region being located between the first partial region and the first outer edge region in a second direction crossing the first direction, the third partial region being located between the first partial region and the second partial region in the second direction, the fourth partial region being located between the third partial region and a part of the second electrode in the first direction, the first partial region, the third partial region, and the fourth partial region being of a first conductivity type, a direction from the first partial region to the third electrode being along the first direction, a direction from the second partial region to the fourth electrode being along the first direction, the second semiconductor region being of a second conductivity type, the second semiconductor region being provided between the fourth partial region and the part of the second electrode in the first direction, the second semiconductor region being located between the third electrode and the fourth electrode in the second direction, and the third semiconductor region being of the first conductivity type, the third semiconductor region being provided between the second semiconductor region and the part of the second electrode, the third semiconductor region being electrically connected to the second electrode;

a first conductive member provided between the first partial region and the third electrode in the first direction, the first conductive member being electrically connected to the second electrode;

a second conductive member including a first conductive portion, the first conductive portion being located between the second partial region and the fourth electrode in the first direction, the second conductive member being electrically connected to the second electrode; and an insulating member including a first insulating region and a second insulating region, the first insulating region being provided between the semiconductor member and the third electrode, between the semiconductor member and the first conductive member, and between the first conductive member and the third electrode, the second insulating region being provided between the semiconductor member and the fourth electrode, between the semiconductor member and the second conductive member, and between the second conductive member and the fourth electrode, the second partial region including a first element, the first partial region not including the first element, or a concentration of the first element in the first partial region being lower than a concentration of the first element in the second partial region, and the first element including at least one selected from the group consisting of hydrogen, helium, and argon.

Configuration 7

The semiconductor device according to Configuration 6, wherein a concentration of the first element in the second partial region is higher than a concentration of the first element in the first outer edge region.

Configuration 8

The semiconductor device according to Configuration 6 or 7, wherein the semiconductor member further includes a fourth semiconductor region provided between the first electrode and the first semiconductor region, the fourth semiconductor region is of the first conductivity type, a carrier concentration of the first conductivity type in the fourth semiconductor region is higher than a carrier concentration of the first conductivity type in the first partial region, the fourth semiconductor region includes a first semiconductor portion and a second semiconductor portion, the first semiconductor portion is located between the first electrode and the first partial region in the first direction, the second semiconductor portion is located between the first electrode and the first outer edge region in the first direction, and a concentration of the first element in the second semiconductor portion is higher than a concentration of the first element in the first semiconductor portion.

Configuration 9

The semiconductor device according to any one of Configurations 6 to 8, wherein a concentration of the first element in at least a part of the third partial region is higher than the concentration of the first element in the first partial region.

Configuration 10

The semiconductor device according to Configuration 9, wherein
the first insulating region includes a first insulating portion,
the first insulating portion is located between the first partial region and the first conductive member in the first direction,
the second insulating region includes a second insulating portion,
the second insulating portion is located between the second partial region and the second conductive member in the first direction, and
at least a part of the third partial region is located between the first insulating portion and the second insulating portion.

Configuration 11

A semiconductor device, comprising:
a first electrode;
a second electrode, a direction from the first electrode to the second electrode being along a first direction;
a third electrode;
a fourth electrode;
a semiconductor member, the semiconductor member including a first semiconductor region, a second semiconductor region and a third semiconductor region, the semiconductor member being provided between the first electrode and the second electrode,
the first semiconductor region including a first outer edge region, a first partial region, a second partial region, a third partial region, and a fourth partial region, the second partial region being located between the first partial region and the first outer edge region in a second direction crossing the first direction, the third partial region being located between the first partial region and the second partial region in the second direction, the fourth partial region being located between the third partial region and a part of the second electrode in the first direction, the first partial region, the third partial region, and the fourth partial region being of a first conductivity type, a direction from the first partial region to the third electrode being along the first direction, a direction from the second partial region to the fourth electrode being along the first direction,
the second semiconductor region being of a second conductivity type, the second semiconductor region being provided between the fourth partial region and the part of the second electrode in the first direction, the second semiconductor region being located between the third electrode and the fourth electrode in the second direction, and
the third semiconductor region being of the first conductivity type, the third semiconductor region being provided between the second semiconductor region and the part of the second electrode, the third semiconductor region being electrically connected to the second electrode;
a first conductive member provided between the first partial region and the third electrode in the first direction, the first conductive member being electrically connected to the second electrode;
a second conductive member including a first conductive portion, the first conductive portion being located between the second partial region and the fourth electrode in the first direction, the second conductive member being electrically connected to the second electrode; and
an insulating member including a first insulating region and a second insulating region, the first insulating region being provided between the semiconductor member and the third electrode, between the semiconductor member and the first conductive member, and between the first conductive member and the third electrode, the second insulating region being provided between the semiconductor member and the fourth electrode, between the semiconductor member and the second conductive member, and between the second conductive member and the fourth electrode,
a crystallinity in the second partial region being lower than a crystallinity in the first partial region.

Configuration 12

The semiconductor device according to Configuration 11, wherein the crystallinity in the second partial region is lower than a crystallinity in the first outer edge region.

Configuration 13

The semiconductor device according to Configuration 11 or 12, wherein
the semiconductor member further includes a fourth semiconductor region provided between the first electrode and the first semiconductor region,
the fourth semiconductor region is of the first conductivity type,
a carrier concentration of the first conductivity type in the fourth semiconductor region is higher than a carrier concentration of the first conductivity type in the first partial region,
the fourth semiconductor region includes a first semiconductor portion and a second semiconductor portion,
the first semiconductor portion is located between the first electrode and the first partial region in the first direction,
the second semiconductor portion is located between the first electrode and the first outer edge region in the first direction, and
a crystallinity of the second semiconductor portion is lower than a crystallinity of the first semiconductor portion.

Configuration 14

The semiconductor device according to any one of Configurations 11 to 13, wherein a crystallinity in at least a part of the third partial region is lower than the crystallinity in the first partial region.

Configuration 15

The semiconductor device according to Configuration 14, wherein
the first insulating region includes a first insulating portion,
the first insulating portion is located between the first partial region and the first conductive member in the first direction,
the second insulating region includes a second insulating portion,
the second insulating portion is located between the second partial region and the second conductive member in the first direction, and
at least a part of the third partial region is located between the first insulating portion and the second insulating portion.

Configuration 16

The semiconductor device according to any one of Configurations 1 to 15, further comprising
- an electrode layer electrically connected to the second electrode,
- at least a part of the second electrode being located between the semiconductor member and the electrode layer in the first direction, and
- the electrode layer overlapping the first partial region and not overlapping the second partial region.

Configuration 17

The semiconductor device according to any one of Configurations 1 to 16, wherein
- the first conductive member extends along a third direction crossing a plane including the first direction and the second direction,
- the second conductive member includes a second conductive portion,
- the first semiconductor region includes a second outer edge region, and
- the second conductive portion is located between the first conductive member and the second outer edge region in the third direction.

Configuration 18

The semiconductor device according to any one of Configurations 1 to 17, wherein the second conductive member is provided around the first conductive member in a plane crossing the first direction.

Configuration 19

A method for manufacturing a semiconductor device, comprising:
- preparing a structural body, the structural body including:
  - a semiconductor member including outer region and inner region, the outer region being around the inner region,
  - a first conductive member and third electrode provided in a first trench of the inner region,
  - a second conductive member and fourth electrode provided in a second trench of the inner region,
  - an electrode layer provided above the third electrode, and
  - an insulating member, at least a part of the insulating member being provided between the third electrode and the electrode layer,
- the second trench being located between the first trench and the outer region,
- the semiconductor member including a first semiconductor region including a first partial region and a second partial region,
- the first conductive member being located between the first partial region and the third electrode in a first direction from the semiconductor member to the electrode layer,
- the second conductive member being located between the second partial region and the fourth electrode in the first direction,
- the electrode layer overlapping the first conductive member and the third electrode in the first direction, and
- the electrode layer not overlapping the second conductive member and the fourth electrode in the first direction;
- introducing a first substance into the second partial region using the electrode layer as a mask to cause the first substance to be not introduced into the first partial region, or to cause a concentration of the first substance in the second partial region to be higher than a concentration of the first substance in the first partial region, the first substance including at least one selected from the group consisting of proton, hydrogen, helium, and argon.

Configuration 20

The semiconductor method according to Configuration 19, wherein
- the semiconductor member further includes a second semiconductor region and a third semiconductor region,
- the first semiconductor region includes a third partial region and a fourth partial region,
- the third partial region is located between the first partial region and the second partial region,
- the second semiconductor region is located between the third partial region and the third semiconductor region,
- the fourth partial region is located between the third partial region and the second semiconductor region,
- the second semiconductor region is located between the third electrode and the fourth electrode,
- the fourth partial region is located between the first conductive member and the second conductive member, and
- the first semiconductor region and the third semiconductor region are of a first conductivity type, and
- the second semiconductor region is of a second conductivity type.

According to the embodiments, it is possible to provide a semiconductor device capable of obtaining stable characteristics.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in semiconductor devices such as semiconductor members, semiconductor regions, electrodes, members, insulating members, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all semiconductor devices practicable by an appropriate design modification by one skilled in the art based on the semiconductor devices described above as embodiments of the invention also are within the scope of the invention to the extent that the purport of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device, comprising:
a first electrode;
a second electrode, a direction from the first electrode to the second electrode being along a first direction;
a third electrode;
a fourth electrode;
a semiconductor member, the semiconductor member including a first semiconductor region, a second semiconductor region and a third semiconductor region, the semiconductor member being provided between the first electrode and the second electrode,
the first semiconductor region including a first outer edge region, a first partial region, a second partial region, a third partial region, and a fourth partial region, the second partial region being located between the first partial region and the first outer edge region in a second direction crossing the first direction, the third partial region being located between the first partial region and the second partial region in the second direction, the fourth partial region being located between the third partial region and a part of the second electrode in the first direction, the first partial region, the third partial region, and the fourth partial region being of a first conductivity type, a direction from the first partial region to the third electrode being along the first direction, a direction from the second partial region to the fourth electrode being along the first direction,
the second semiconductor region being of a second conductivity type, the second semiconductor region being provided between the fourth partial region and the part of the second electrode in the first direction, the second semiconductor region being located between the third electrode and the fourth electrode in the second direction, and
the third semiconductor region being of the first conductivity type, the third semiconductor region being provided between the second semiconductor region and the part of the second electrode, the third semiconductor region being electrically connected to the second electrode;
a first conductive member provided between the first partial region and the third electrode in the first direction, the first conductive member being electrically connected to the second electrode;
a second conductive member including a first conductive portion, the first conductive portion being located between the second partial region and the fourth electrode in the first direction, the second conductive member being electrically connected to the second electrode; and
an insulating member including a first insulating region and a second insulating region, the first insulating region being provided between the semiconductor member and the third electrode, between the semiconductor member and the first conductive member, and between the first conductive member and the third electrode, the second insulating region being provided between the semiconductor member and the fourth electrode, between the semiconductor member and the second conductive member, and between the second conductive member and the fourth electrode,
an electrical resistivity of the second partial region being higher than an electrical resistivity of the first partial region.

2. The device according to claim 1, wherein the electrical resistivity of the second partial region is higher than an electrical resistivity of the first outer edge region.

3. The device according to claim 1, wherein
the semiconductor member further includes a fourth semiconductor region provided between the first electrode and the first semiconductor region,
the fourth semiconductor region is of the first conductivity type,
a carrier concentration of the first conductivity type in the fourth semiconductor region is higher than a carrier concentration of the first conductivity type in the first partial region,
the fourth semiconductor region includes a first semiconductor portion and a second semiconductor portion,
the first semiconductor portion is located between the first electrode and the first partial region in the first direction,
the second semiconductor portion is located between the first electrode and the first outer edge region in the first direction, and
an electrical resistivity of the second semiconductor portion is higher than an electrical resistivity of the first semiconductor portion.

4. The device according to claim 1, wherein an electrical resistivity of at least a part of the third partial region is higher than the electrical resistivity of the first partial region.

5. The device according to claim 4, wherein
the first insulating region includes a first insulating portion,
the first insulating portion is located between the first partial region and the first conductive member in the first direction,
the second insulating region includes a second insulating portion,
the second insulating portion is located between the second partial region and the second conductive member in the first direction, and
at least a part of the third partial region is located between the first insulating portion and the second insulating portion.

6. A semiconductor device, comprising:
a first electrode;
a second electrode, a direction from the first electrode to the second electrode being along a first direction;
a third electrode;
a fourth electrode;
a semiconductor member, the semiconductor member including a first semiconductor region, a second semiconductor region and a third semiconductor region, the semiconductor member being provided between the first electrode and the second electrode,
the first semiconductor region including a first outer edge region, a first partial region, a second partial region, a third partial region, and a fourth partial region, the second partial region being located between the first partial region and the first outer edge region in a second direction crossing the first direction, the third partial region being located between the first partial region and the second partial region in the second direction, the fourth partial region being located between the third partial region and a part of the second electrode in the first direction, the first partial region, the third partial region, and the fourth partial region being of a first conductivity type, a direction from the first partial region to the third electrode being along the first direction, a direction from the second partial region to the fourth electrode being along the first direction, the second semiconductor region being of a second conductivity type, the second semiconductor region being provided between the fourth partial region and the part of the second electrode in the first direction, the second semiconductor region being located between the third electrode and the fourth electrode in the second direction, and the third semiconductor region being of the first conductivity type, the third semiconductor region being provided between the second semiconductor region and the part of the second electrode, the third semiconductor region being electrically connected to the second electrode;

a first conductive member provided between the first partial region and the third electrode in the first direction, the first conductive member being electrically connected to the second electrode;

a second conductive member including a first conductive portion, the first conductive portion being located between the second partial region and the fourth electrode in the first direction, the second conductive member being electrically connected to the second electrode; and an insulating member including a first insulating region and a second insulating region, the first insulating region being provided between the semiconductor member and the third electrode, between the semiconductor member and the first conductive member, and between the first conductive member and the third electrode, the second insulating region being provided between the semiconductor member and the fourth electrode, between the semiconductor member and the second conductive member, and between the second conductive member and the fourth electrode, the second partial region including a first element, the first partial region not including the first element, or a concentration of the first element in the first partial region being lower than a concentration of the first element in the second partial region, and the first element including at least one selected from the group consisting of hydrogen, helium, and argon.

7. The device according to claim 6, wherein a concentration of the first element in the second partial region is higher than a concentration of the first element in the first outer edge region.

8. The device according to claim 6, wherein the semiconductor member further includes a fourth semiconductor region provided between the first electrode and the first semiconductor region, the fourth semiconductor region is of the first conductivity type, a carrier concentration of the first conductivity type in the fourth semiconductor region is higher than a carrier concentration of the first conductivity type in the first partial region, the fourth semiconductor region includes a first semiconductor portion and a second semiconductor portion, the first semiconductor portion is located between the first electrode and the first partial region in the first direction, the second semiconductor portion is located between the first electrode and the first outer edge region in the first direction, and a concentration of the first element in the second semiconductor portion is higher than a concentration of the first element in the first semiconductor portion.

9. The device according to claim 6, wherein a concentration of the first element in at least a part of the third partial region is higher than the concentration of the first element in the first partial region.

10. The device according to claim 9, wherein the first insulating region includes a first insulating portion, the first insulating portion is located between the first partial region and the first conductive member in the first direction, the second insulating region includes a second insulating portion, the second insulating portion is located between the second partial region and the second conductive member in the first direction, and at least a part of the third partial region is located between the first insulating portion and the second insulating portion.

11. A semiconductor device, comprising:

a first electrode;

a second electrode, a direction from the first electrode to the second electrode being along a first direction;

a third electrode;

a fourth electrode;

a semiconductor member, the semiconductor member including a first semiconductor region, a second semiconductor region and a third semiconductor region, the semiconductor member being provided between the first electrode and the second electrode, the first semiconductor region including a first outer edge region, a first partial region, a second partial region, a third partial region, and a fourth partial region, the second partial region being located between the first partial region and the first outer edge region in a second direction crossing the first direction, the third partial region being located between the first partial region and the second partial region in the second direction, the fourth partial region being located between the third partial region and a part of the second electrode in the first direction, the first partial region, the third partial region, and the fourth partial region being of a first conductivity type, a direction from the first partial region to the third electrode being along the first direction, a direction from the second partial region to the fourth electrode being along the first direction, the second semiconductor region being of a second conductivity type, the second semiconductor region being provided between the fourth partial region and the part of the second electrode in the first direction, the second semiconductor region being located between the third electrode and the fourth electrode in the second direction, and the third semiconductor region being of the first conductivity type, the third semiconductor region being provided between the second semiconductor region and the part of the second electrode, the third semiconductor region being electrically connected to the second electrode;

a first conductive member provided between the first partial region and the third electrode in the first direction, the first conductive member being electrically connected to the second electrode;

a second conductive member including a first conductive portion, the first conductive portion being located between the second partial region and the fourth electrode in the first direction, the second conductive member being electrically connected to the second electrode; and an insulating member including a first insulating region and a second insulating region, the first insulating region being provided between the semiconductor member and the third electrode, between the semiconductor member and the first conductive member, and between the first conductive member and the third electrode, the second insulating region being provided between the semiconductor member and the fourth electrode, between the semiconductor member and the second conductive member, and between the second conductive member and the fourth electrode, a crystallinity in the second partial region being lower than a crystallinity in the first partial region.

12. The device according to claim 11, wherein the crystallinity in the second partial region is lower than a crystallinity in the first outer edge region.

13. The device according to claim 11, wherein
the semiconductor member further includes a fourth semiconductor region provided between the first electrode and the first semiconductor region,
the fourth semiconductor region is of the first conductivity type,
a carrier concentration of the first conductivity type in the fourth semiconductor region is higher than a carrier concentration of the first conductivity type in the first partial region,
the fourth semiconductor region includes a first semiconductor portion and a second semiconductor portion,
the first semiconductor portion is located between the first electrode and the first partial region in the first direction,
the second semiconductor portion is located between the first electrode and the first outer edge region in the first direction, and
a crystallinity of the second semiconductor portion is lower than a crystallinity of the first semiconductor portion.

14. The device according to claim 11, wherein a crystallinity in at least a part of the third partial region is lower than the crystallinity in the first partial region.

15. The device according to claim 14, wherein
the first insulating region includes a first insulating portion,
the first insulating portion is located between the first partial region and the first conductive member in the first direction,
the second insulating region includes a second insulating portion,
the second insulating portion is located between the second partial region and the second conductive member in the first direction, and
at least a part of the third partial region is located between the first insulating portion and the second insulating portion.

16. The device according to claim 1, further comprising
an electrode layer electrically connected to the second electrode,
at least a part of the second electrode being located between the semiconductor member and the electrode layer in the first direction, and
the electrode layer overlapping the first partial region and not overlapping the second partial region.

17. The device according to claim 1, wherein
the first conductive member extends along a third direction crossing a plane including the first direction and the second direction,
the second conductive member includes a second conductive portion,
the first semiconductor region includes a second outer edge region, and
the second conductive portion is located between the first conductive member and the second outer edge region in the third direction.

18. The device according to claim 1, wherein the second conductive member is provided around the first conductive member in a plane crossing the first direction.

* * * * *